(12) United States Patent
Helinski

(10) Patent No.: US 9,667,231 B1
(45) Date of Patent: May 30, 2017

(54) FAST FREQUENCY DIVIDER CIRCUIT USING COMBINATIONAL LOGIC

(71) Applicant: Sandia Corporation, Albuquerque, NM (US)

(72) Inventor: Ryan Helinski, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 15/077,598

(22) Filed: Mar. 22, 2016

Related U.S. Application Data

(60) Provisional application No. 62/138,250, filed on Mar. 25, 2015.

(51) Int. Cl.
| | | |
|---|---|---|
| *H03B 19/00* | (2006.01) | |
| *H03K 3/03* | (2006.01) | |
| *H03K 3/037* | (2006.01) | |
| *H03K 21/10* | (2006.01) | |

(52) U.S. Cl.
CPC ......... *H03K 3/0315* (2013.01); *H03K 3/0372* (2013.01); *H03K 21/10* (2013.01)

(58) Field of Classification Search
CPC ...................................................... H03B 19/12
USPC ........................................................ 327/117
See application file for complete search history.

(56) References Cited

U.S. PATENT DOCUMENTS

| | | | |
|---|---|---|---|
| 4,517,532 A | | 5/1985 | Neidorff |
| 5,448,191 A | * | 9/1995 | Meyer ..................... H03L 7/081 327/105 |
| 5,668,504 A | * | 9/1997 | Rodriques Ramalho ................................ H03L 7/081 327/145 |
| 7,420,870 B2 | * | 9/2008 | Park ..................... H03K 3/0315 327/156 |
| 2003/0204345 A1 | * | 10/2003 | Giger ..................... G01S 17/36 702/75 |
| 2003/0219091 A1 | * | 11/2003 | Riley ................... H03L 7/1976 377/47 |

(Continued)

OTHER PUBLICATIONS

Pan, Yang "Ring Oscillator Frequency Measurements Using an Automated Parametric Test System", Keithley Instruments White Paper, 2008, pp. 1-12.

(Continued)

*Primary Examiner* — Ryan Jager
(74) *Attorney, Agent, or Firm* — Medley, Behrens & Lewis, LLC

(57) ABSTRACT

The various technologies presented herein relate to performing on-chip frequency division of an operating frequency of a ring oscillator (RO). Per the various embodiments herein, a conflict between RO size versus operational frequency can be addressed by dividing the output frequency of the RO to a frequency that can be measured on-chip. A frequency divider circuit (comprising NOR gates and latches, for example) can be utilized in conjunction with the RO on the chip. In an embodiment, the frequency divider circuit can include a pair of latches coupled to the RO to facilitate dividing the oscillating frequency of the RO by 2. In another embodiment, the frequency divider circuit can include four latches (operating in pairs) coupled to the RO to facilitate dividing the oscillating frequency of the RO by 4. A plurality of ROs can be MUXed to the plurality of ROs by a single oscillation-counting circuit.

20 Claims, 6 Drawing Sheets

(56) References Cited

U.S. PATENT DOCUMENTS

| | | | | |
|---|---|---|---|---|
| 2004/0027157 A1* | 2/2004 | Hirota | ............... | H03K 5/133 |
| | | | | 326/66 |
| 2006/0097804 A1* | 5/2006 | Im | ............... | H02M 3/073 |
| | | | | 331/57 |
| 2009/0045882 A1* | 2/2009 | Kim | ............... | H03K 3/0315 |
| | | | | 331/57 |
| 2009/0052586 A1* | 2/2009 | Iida | ............... | H04B 1/71637 |
| | | | | 375/340 |
| 2009/0097373 A1* | 4/2009 | Nishiyama | ............... | G11B 7/005 |
| | | | | 369/53.34 |
| 2009/0174486 A1* | 7/2009 | Haralabidis | ............... | H03B 21/01 |
| | | | | 331/45 |
| 2015/0145572 A1* | 5/2015 | Sato | ............... | G04F 10/005 |
| | | | | 327/159 |

OTHER PUBLICATIONS

Ferraiuolo, et al., "Experimental Analysis of a Ring Oscillator Network for Hardware Trojan Detection in a 90nm ASIC", IEEE/ACM International Conference on Computer-Aided Design (ICCAD), 2012, pp. 37-42.

Grozing, et al., "CMOS Ring Oscillator with Quadrature Outputs and 100 MHz to 3.5 GHz Tuning Range", 29th European Solid-State Circuits Conference 2003 (ESSCIRC 2003), 2003, pp. 1-4.

Kim, et al. "Silicon Odometer: An On-Chip Reliability Monitor for Measuring Frequency Degradation of Digital Circuits", IEEE Journal of Solid-State Circuits, vol. 43, No. 4, 2008, pp. 874-880.

\* cited by examiner

FAST FREQUENCY DIVIDER CIRCUIT USING COMBINATIONAL LOGIC

RELATED APPLICATION

This application claims priority to U.S. Provisional Patent Application No. 62/138,250, filed on Mar. 25, 2015, and entitled "FAST FREQUENCY DIVIDER CIRCUIT USING COMBINATIONAL LOGIC", the entirety of which is incorporated herein by reference.

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

A typical off-chip method for measuring an oscillating frequency of a ring oscillator (RO) is to utilize a master/slave flip-flop that has its clock input driven by the RO output. Typically, the RO is included in an integrated circuit (IC) located on a chip, and while the flip-flop is also an on-chip device, it is central and shared among a plurality of ROs, wherein the flip-flop has to reach the plurality of ROs. Flip-flop circuits are typically complex and have a bandwidth that is slow relative to the free-running frequency of a small RO. To measure an operational frequency of a RO with a master/slave flip-flop, the RO is typically scaled up (by adding more stages) so that the frequency at the last stage is lower. However, the overall variation in RO frequency is reduced by adding more stages, which works against the objective of utilizing an RO to facilitate measurement of process variations during manufacture of application-specific integrated circuits (ASICs), for example. In effect, signal variation across the various components of an RO circuit are averaged such that individual variation from a single stage in the RO circuit is masked (e.g., cancelled out) by the variation of the other stages of the RO circuit. Hence, the benefit of incorporating a RO into an ASIC to determine whether the ASIC was manufactured with an expected manufacturing process may be diminished, as the sensitivity of the RO to the variances inherent to the manufacturing process are masked.

SUMMARY

The following is a brief summary of subject matter that is described in greater detail herein. This summary is not intended to be limiting as to the scope of the claims.

The various embodiments presented herein relate to determining an oscillating frequency of a ring oscillator (RO), wherein the determination is performed on-chip. More specifically, a frequency divider circuit is directly integrated with the RO on-chip. Owing to increasing reduction in feature size and a phenomenon that as a RO reduces in size (e.g., comprises a small number of stages) the operational frequency of the RO increases, it can be a challenge to manufacture an integrated circuit (IC) that includes an RO co-located with a frequency divider (e.g., a master slave flip flop) to facilitate on-chip determination of the operational oscillating frequency of the RO. The various embodiments presented herein enable manufacture of an IC (e.g., an application-specific integrated circuit (ASIC)) comprising a RO and a frequency divider circuit to facilitate on-chip measurement of the operational oscillating frequency of the RO, and further, output a signal from which the operational oscillating frequency of the RO can be determined. The various embodiments presented herein can also be utilized for a RO-based physical unclonable function(s) (PUF(s)).

In an embodiment, the frequency divider circuit includes a NAND gate structure (comprising a plurality of NAND gates) and a plurality of latches. In operation, a plurality of signals from the RO are input into the NAND gate structure. In an embodiment, three signals from the RO are provided to two NAND gates. An input of a penultimate inverter in the RO structure is connected to a first input of a first NAND gate. An input of the last inverter in the RO structure is connected to a first input of a second NAND gate, such that an input signal to the last inverter is provided as a first input signal to the second NAND gate. The output from the last inverter is connected to the second input of the first NAND gate and the second input of the second NAND gate, such that an output signal from the last inverter is provided as both a second input signal to the first NAND gate and a second input signal to the second NAND gate. The respective outputs from the two NAND gates are respectively input into a pair of latches of the frequency divider circuit. The latches are electrically interconnected (as will be described herein), an active-high output of the second latch is the oscillating signal frequency of the RO divided by 2. Addition of additional pairs of latches in the frequency divider circuit can result in the RO frequency being further divided by a factor of two.

In a further embodiment, a RO comprising any number of stages can be utilized, e.g., a three stage RO, a five stage RO, a seven stage RO, etc., wherein a first stage in the RO is a NAND gate and the last two stages in the RO are a first inverter (e.g., a penultimate inverter) and a second inverter (e.g., a last inverter).

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
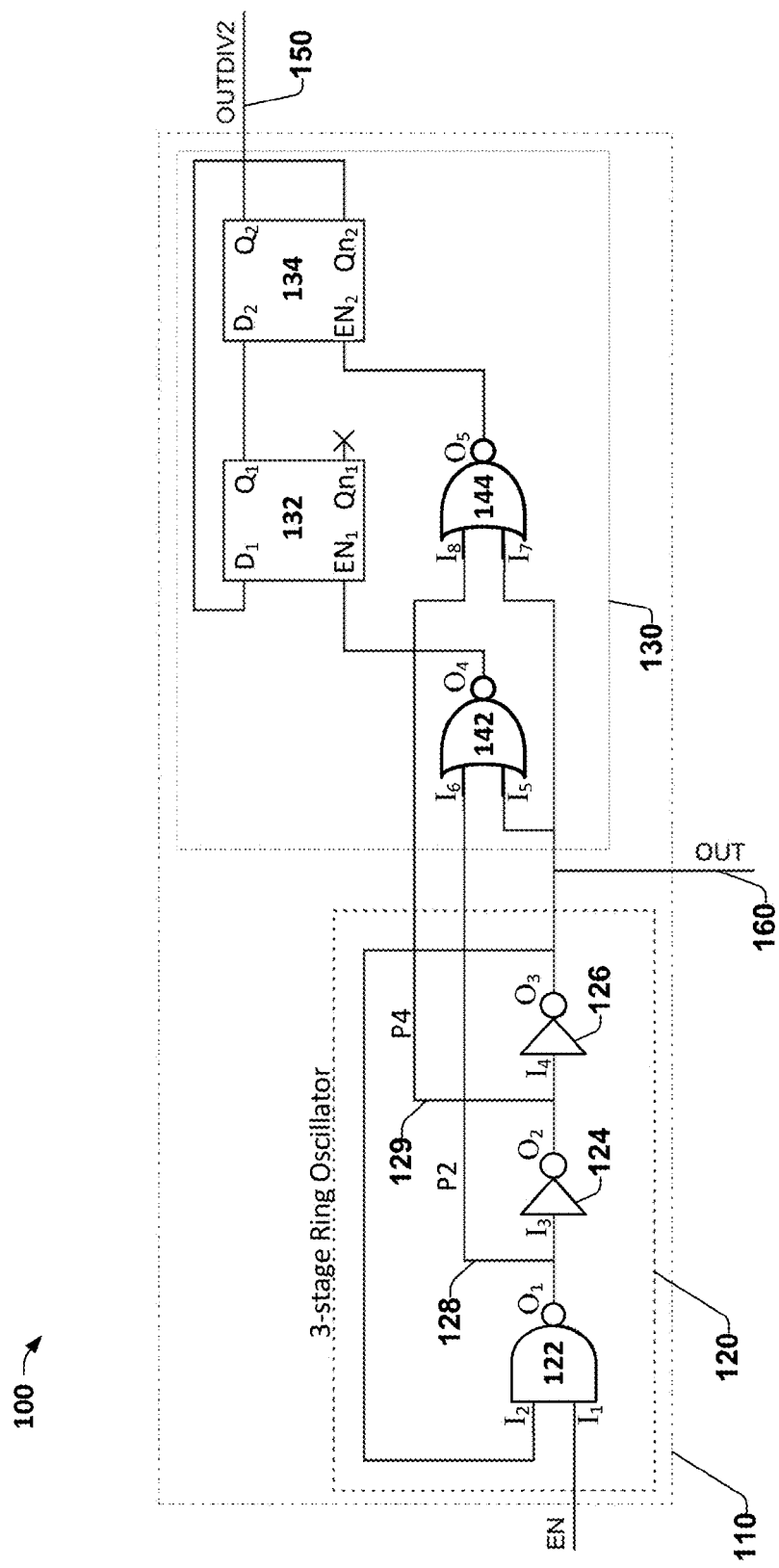
FIG. 1 is a block diagram of an exemplary electrical circuit for enabling on-chip measurement of an oscillating frequency of a ring oscillator (RO).

Various technologies are presented herein pertaining to performing on-chip frequency determinations for a chip-based RO, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

As used herein, the terms "component", "device", and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. The terms "component", "device", and "system" are also intended to encompass hardware configured to cause certain functionality to be performed, where such hardware can include, but is not limited to including, Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Further, the term "or" is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

As previously mentioned, attempting to obtain on-chip frequency measurements from a ring oscillator (RO) can be problematic when a number of stages of the RO is relatively small. For example, the RO can be located on a 3×3 millimeter (mm) IC, using 350 nanometer (nm) technology. For an understanding of the effect of number of stages in a RO versus the number of ROs that can be incorporated into a device (e.g., 3×3 mm IC), the following is provided. 5-stage ROs could occupy approximately 0.28 $\mu m^2$ and a 3-stage would occupy ⅗ of that area, 0.168 $\mu m^2$, meaning that for a 3-stage configuration: 53 million ROs would fit in 9 $mm^2$, or 535,000 ROs if only 1% area were permitted. For a 5-stage configuration: 32 million ROs would fit in 9 $mm^2$ or 321,000 ROs if only 1% area were permitted. For a 30-stage configuration: 5.2 million ROs would fit in 9 $mm^2$ or 52,000 ROs if only 1% area were permitted (1.74 $\mu m^2$ area per RO).

Conventionally, to measure frequency of a RO, the RO must include a large number of stages, e.g., typically ROs comprising 30 stages (e.g., 29 or 31) are utilized. However, as previously mentioned, as more stages are utilized, their individual variability becomes lost as the operation tends to an average frequency of operation. It may therefore be desirable to utilize fewer stages; however, the output frequency can become difficult to measure. Per the various embodiments presented herein, the conflict between RO size versus operational frequency can be addressed by tightly integrating a frequency divider with the RO, such that the signal output by the frequency divider is readily measurable. More specifically, a frequency divider circuit (comprising NAND gates and latches) can be utilized in conjunction with the RO on the chip. In an embodiment, the frequency divider circuit can include a pair of latches to facilitate dividing the oscillating frequency of the RO by 2. In another embodiment, the frequency divider circuit can include four latches (operating in pairs) coupled to the RO to facilitate dividing the oscillating frequency of the RO by 4.

The various embodiments presented herein enable manufacture of an IC (e.g., an application-specific integrated circuit (ASIC)) comprising a RO and a frequency divider circuit to facilitate on-chip measurement of the operational oscillating frequency of the RO, and further, outputs a signal from which the operational oscillating frequency of the RO can be determined. The various embodiments presented herein can also be utilized for a RO-based physical unclonable function(s) (PUF(s)).

FIG. 1 illustrates an electrical circuit 100 comprising a RO and a frequency divider, wherein the frequency divider enables division of the frequency of the output signal of the RO to a frequency that can be measured on-chip. Electrical circuit 100 exploits the rotating pattern of 0's and 1's in the RO and utilizes two separate latches to form the frequency divider.

Electrical circuit 100 comprises an IC 110 having located thereon a RO 120 and a frequency divider 130, wherein, upon excitation with an energizing signal EN, signals output from the RO 120 are input into the frequency divider 130. As shown in FIG. 1, the RO 120 can be a 3-stage RO, and comprises a NAND gate 122, a first inverter 124, and a second inverter 126, coupled in series (e.g., a NAND, NOT, NOT configuration). The frequency divider 130 comprise a first NOR gate 142 and a second NOR gate 144. As further described, the NOR gate configuration presented here is only one example that can be utilized, in another embodiment, AND gates can be utilized. Further, the frequency divider 130 comprises a first latch 132 and a second latch 134.

Working left to right from the NAND gate 122 to the second latch 134, the respective inputs, outputs, and connections are now presented. The NAND gate 122 has a pair of inputs $I_1$ and $I_2$, and an output $O_1$. The inverter 124 has an input $I_3$ and an output $O_2$. The inverter 126 has an input $I_4$ and an output $O_3$. The NOR gate 142 has inputs $I_5$ and $I_6$, and output $O_4$. The NOR gate 144 has inputs $I_7$ and $I_8$, and output $O_5$. The first latch 132 has inputs $D_1$ and $EN_1$, and outputs $Q_1$ and $Qn_1$. The second latch 134 has inputs $D_2$ and $EN_2$, and outputs $Q_2$ and $Qn_2$.

As shown on FIG. 1, an input signal EN is received at the input $I_1$ of the NAND gate 122, with a signal output from $O_1$ to the input $I_3$ of the inverter 124. The inverted signal is output from $O_2$ to input $I_4$ of the inverter 126. The signal is output from $O_3$ of the inverter 126 to the input $I_5$ of the NOR gate 142, and also to the input $I_7$ of the NOR gate 144, and further, the signal from $O_3$ is also fed back to the input $I_2$ of the NAND gate 122. The output $O_1$ of the NAND gate 122 is also connected to the input $I_6$ of the NOR gate 142 (via line 128). The output $O_2$ of the inverter 124 is also connected to the input $I_8$ of the NOR gate 144 (via line 129). Hence, based upon the circuit logic, the two output signals from respective outputs $O_4$ and $O_5$ have been generated from the single input signal EN.

As further shown in FIG. 1, the output $O_4$ is connected to the input $EN_1$ of the first latch 132, and the output $O_5$ is connected to the input $EN_2$ of the second latch 134. The two latches 132 and 134 are coupled together by virtue of the output $Qn_2$ of the second latch 134 being connected to the input $D_1$ of the first latch 132, in turn the output $Q_1$ of the first latch 132 is connected to the input $D_2$ of the second latch 134, and the signal OUTDIV2 is on the output Q2 of the second latch 134. The OUTDIV2 signal, on line 150, is a square wave signal having a frequency that is ½ of the oscillating frequency of the RO 120 (shown in FIG. 1 as being the OUT signal) on line 160.

During operation of the electrical circuit 100, the NAND gate 122 is utilized to enable or disable the RO 120. Rather than only allowing the output node 126 to be utilized by the frequency divider, each stage of the RO 120 can be tapped, per the signals on lines 128 and 129.

The progression of the state of the RO 120, except for gate delays, can be represented in the following, Table 1. The first three row headers on the left-hand side represent the nodes (NAND 122, inverter 124, inverter 126) of the circuit 100, which are the outputs of the three stages of the RO 120 (O1, O2, O3). The column headers represent the states of the circuit over time starting at an arbitrary point 0. The circuit oscillates in six states on this scale. Essentially, the sequence {0,1,0} rotates around the RO 120. At time point 0, the state is {1,1,0}. In this state, the input I3 to inverter 124 is a 1 but its output O2 is a 0 so the inverter transitions its output to a 0. At time point 1, the output O2 of inverter 124 is now a 0, but the output O3 of inverter 126 is a 0 and so inverter 126 transitions. At time step 2, the output O3 of inverter 126 is a 1 and the output of NAND 122 is a 1 and so NAND 122 switches its output O1 to a 0 (1 nand 1 is 0). These switching events continue around the RO 120 until time point 6 which is the same as time point 0 and then the pattern repeats.

TABLE 1

RO State Progression

| | 0 | 1 | 2 | 3 | 4 | 5 | 6 | 7 | 8 | 9 | 10 | 11 |
|---|---|---|---|---|---|---|---|---|---|---|---|---|
| NAND 122 | 1 | 1 | 1 | 0 | 0 | 0 | 1 | 1 | 1 | 0 | 0 | 0 |
| INV 124 | 1 | 0 | 0 | 0 | 1 | 1 | 1 | 1 | 0 | 0 | 1 | 1 |
| INV 126 | 0 | 0 | 1 | 1 | 1 | 0 | 0 | 0 | 1 | 1 | 1 | 0 |
| NOR 142 | 0 | 0 | 0 | 0 | 0 | 1 | 0 | 0 | 0 | 0 | 0 | 1 |
| NOR 144 | 0 | 1 | 0 | 0 | 0 | 0 | 1 | 0 | 0 | 0 | 0 | 0 |
| LATCH 132 | 0 | 0 | 0 | 0 | 0 | 1 | 1 | 1 | 1 | 1 | 1 | 0 |
| LATCH 134 | 1 | 0 | 0 | 0 | 0 | 0 | 0 | 1 | 1 | 1 | 1 | 1 |

To count the number of periods of the RO, two non-overlapping intervals in a single period are utilized to enable operation of the two latches 132 and 134 in a mutually-exclusively fashion. This emulates the theory of operation of the master/slave flip-flop. To simplify the logic circuitry, the states 1 and 5 of the period (which are identical to states 7 and 11) have been chosen, per Table 1. The choice of these two presented states are example states. Another example of a valid choice would be states 2 and 4, in which case, AND gates could be utilized in place of the NOR gates 142 and 144 presented herein. Two new signals, O4 and O5 are generated using NOR gates 142 and 144. They can be expressed by O4=~(NAND0 v INV2) and O5=~(INV1 v INV2). Finally, these two signals O4 and O5 are connected to the two latches 132 and 134, with the input $D_1$ of the first latch 132 connected to the active-low output of the second latch $Qn_2$, and the input $D_2$ to the second latch 134 connected to the active-high output $Q_1$ of the first latch 132. The active-high output $Q_2$ of the second latch 134 is the oscillating signal frequency-divided by 2, as shown in the last two rows of Table 1.

Figure 2:
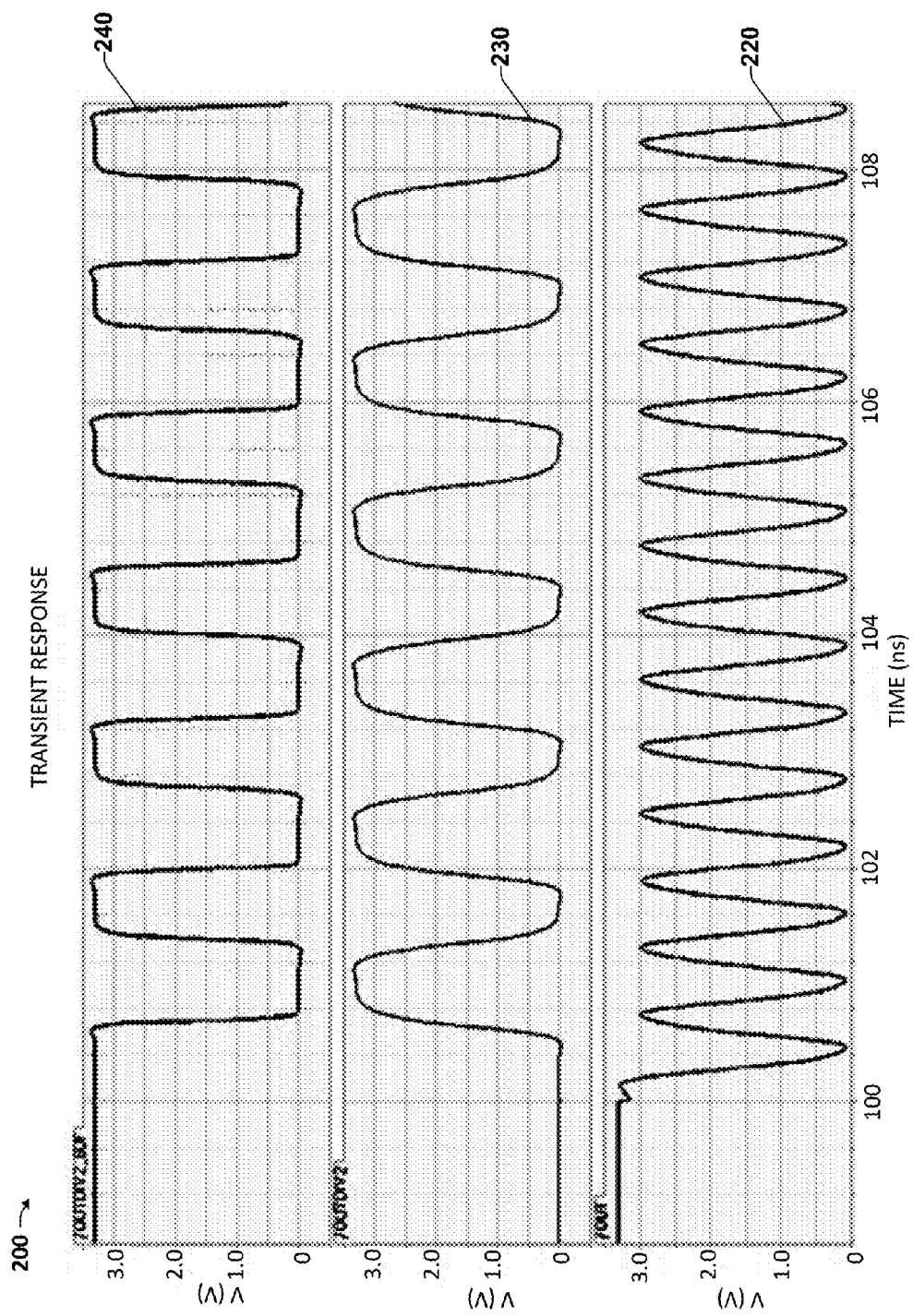
FIG. 2 presents a plurality of plots of oscillating frequencies measured on a RO with frequency division.

During experimentation, the nominal oscillating frequency of the three-stage RO 120 for a 0.35 μm process was 1.7 GHz, while the divided frequency was 850 MHz, which can be latched by a typical frequency divider implemented with a master/slave flip-flop. Experimental results are presented in FIG. 2, plot 200, presenting respective signal measurements as a function of time in nanoseconds (ns) versus voltage (V). Plot 220 is a plot of the OUT signal measured on line 160, wherein plot 220 is a plot of the oscillating frequency of the RO 120. Plot 230 is a plot of the OUTDIV2 signal measured at the output $Q_2$ of the second latch 134, and is the oscillating signal frequency-divided by 2. Plot 240 depicts a buffered inverse, which could be produced by a tri-state buffer in practice, of the signal shown in plot 230.

Figure 3:
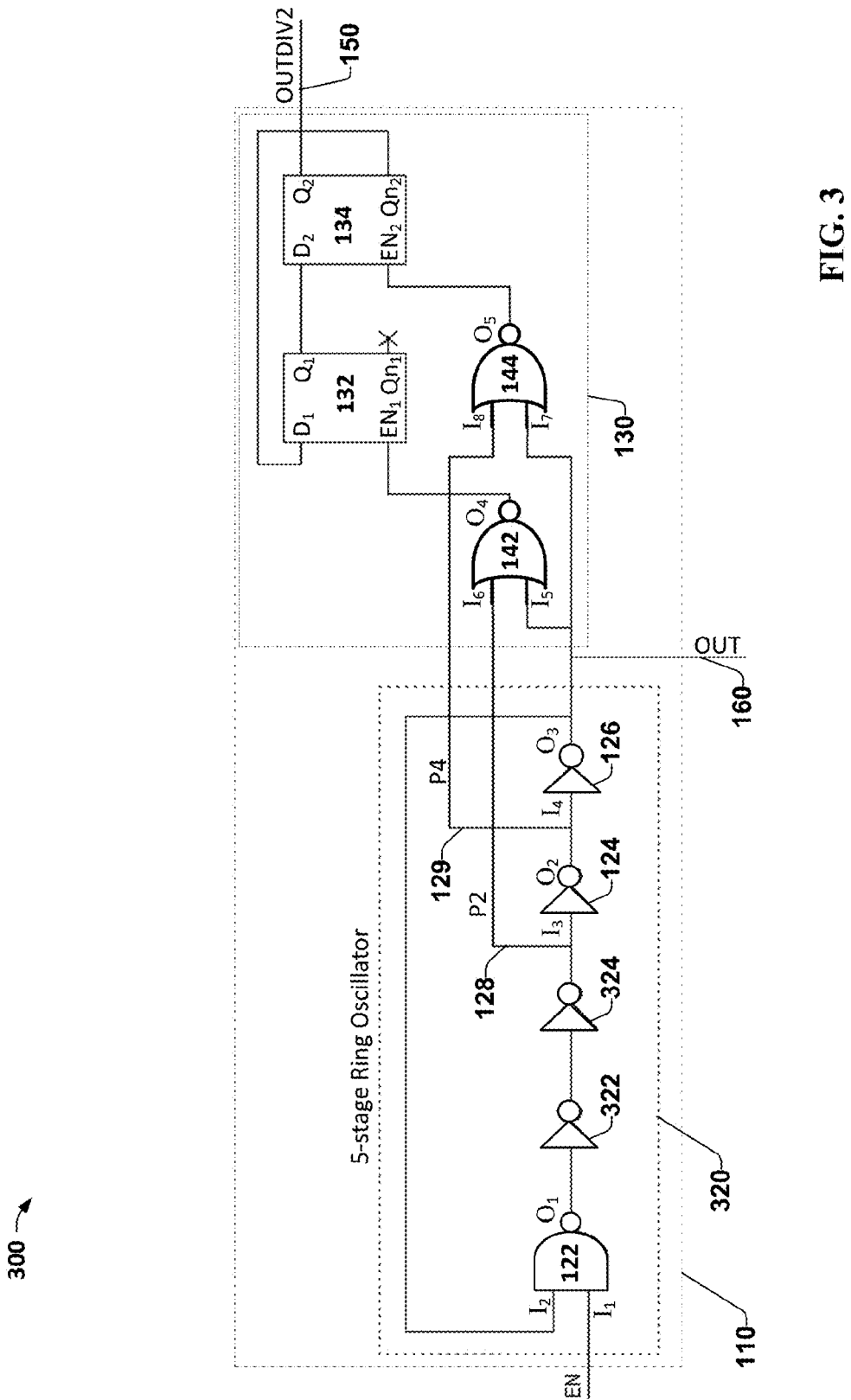
FIG. 3 is a block diagram of an exemplary electrical circuit for enabling on-chip measurement of an oscillating frequency of a five stage RO.

As previously mentioned, the RO 120 can comprise a plurality of stages, wherein RO 120 presented in FIG. 1 is a three stage RO. Turning to FIG. 3, an electrical circuit 300 comprising a five-stage RO is presented. To facilitate description brevity, the NOR gates 142 and 144 and the pair of latches 132 and 134 have the same configuration and nomenclature/identifiers as used in FIG. 1. However, as shown in FIG. 3, a RO 320 is presented comprising two more inverters 322 and 324 coupled in series with the NAND 122, and the inverters 124 and 126. As shown, the respective inputs $I_6$ and $I_8$ of NORs 142 and 144 are both respectively fed with signals captured from the input $I_3$ of the penultimate inverter 124, and the input $I_4$ of the last inverter 126 in the RO 320 (having the configuration NAND, NOT, NOT, NOT, NOT). Hence, even though the RO 320 has more stages than the RO 120, it is still possible to obtain OUTDIV2 at output $Q_2$ (line 150) of the latch 134. It is to be appreciated that while FIG. 3 presents an RO comprising five stages (e.g., NAND, NOT, NOT, NOT, NOT), any size RO can be utilized with the various embodiments presented herein, e.g., a seven stage RO, a nine stage RO, an eleven stage RO, etc. In an embodiment, the first component in the RO is a NAND gate and the last two components in the RO are a first inverter (e.g., a penultimate inverter) and a second inverter (e.g., a last inverter).

Figure 4:
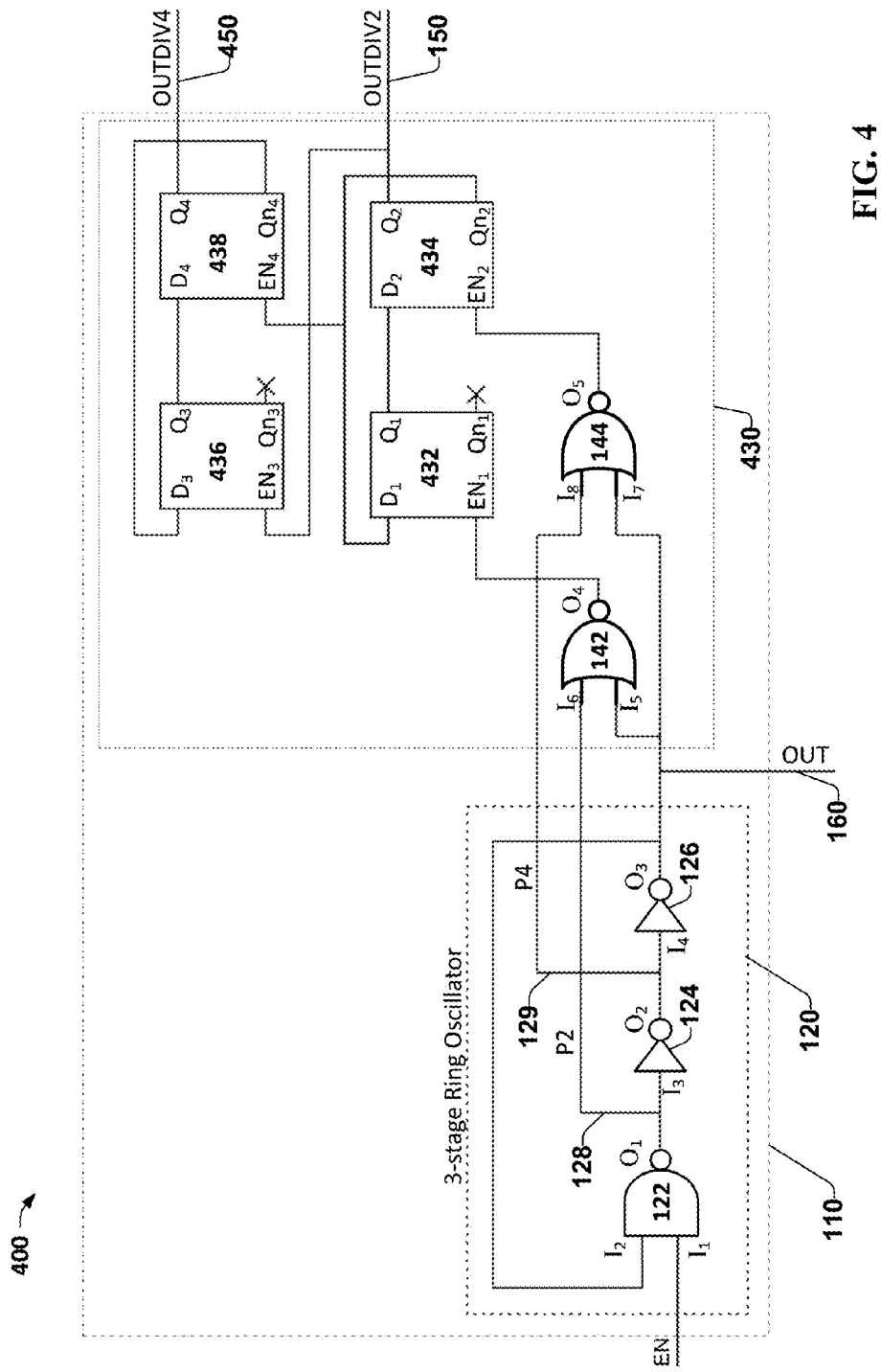
FIG. 4 is a block diagram of an exemplary electrical circuit for enabling on-chip measurement of an oscillating frequency of a RO, wherein a plurality of frequency divisions are generated.

Further, while FIGS. 1 and 3 have been depicted as including the pair of latches 132 and 134 to obtain OUTDIV2, it is also possible, as previously mentioned, to obtain an output that has a divided frequency of ¼ of the oscillating frequency of a RO. FIG. 4 illustrates an electrical circuit 400 comprising a frequency divider 430 that includes two pairs of latches 432 & 434, and 436 & 438. To facilitate description brevity, the 3-stage RO 120 and the pair of NOR gates 142 and 144 have the same configuration and nomenclature/identifiers as used in FIG. 1. However, as shown in FIG. 4, an output OUTDIV2 (on line 150) can be measured at the Q2 of the second latch 434, and an output OUTDIV4 (on line 450) can be measured at the Q4 of the fourth latch 438 latch 434. As shown, the respective inputs $I_6$ and $I_8$ of NORs 142 and 144 are both respectively fed with signals captured from the input $I_3$ of the penultimate inverter 124, and the input $I_4$ of the last inverter 126 in the RO 120 (having the configuration NAND, NOT, NOT). In comparison with FIG. 1, per FIG. 4, the output from Q2 of the second latch 434 is connected to input $EN_3$ of the third latch 436, and the output from Qn2 of the second latch is connected to the input $EN_4$ of the fourth latch 438. Further, the two latches 436 and 438 are coupled together by virtue of the output $Qn_4$ of the fourth latch 438 being connected to the input $D_3$ of the third latch 436, wherein the output $Q_3$ of the third latch 436 is connected to the input $D_4$ of the fourth latch 438, and the signal OUTDIV4 is on the output $Q_4$ of the fourth latch 438.

Figure 5:
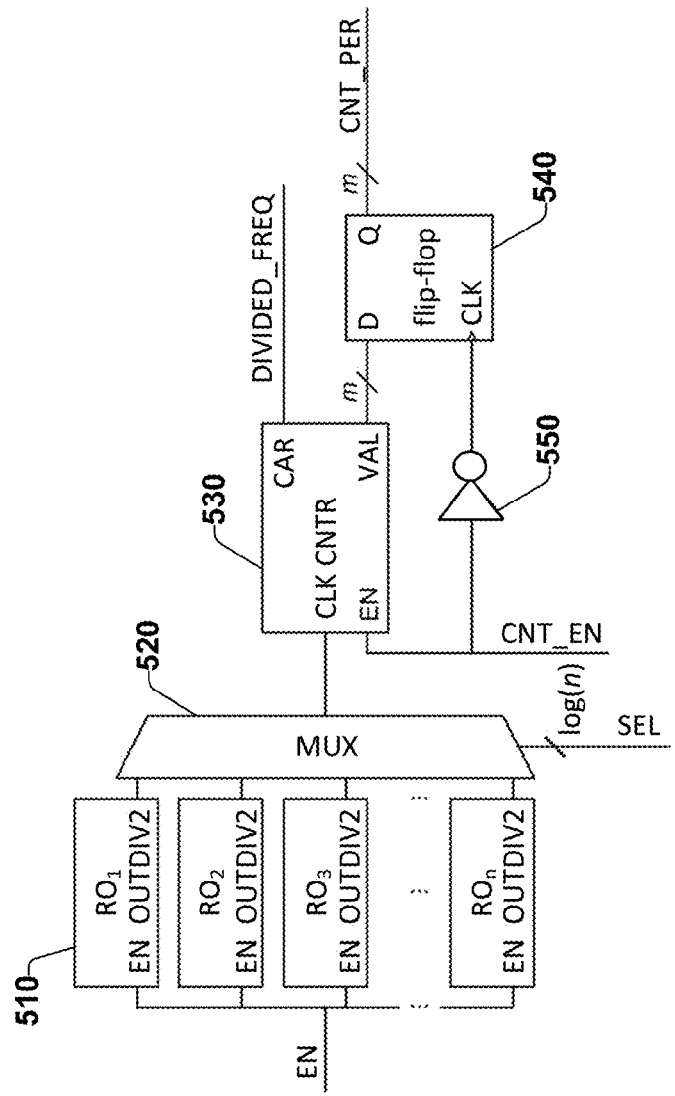
FIG. 5 is a block diagram of an exemplary electrical circuit for determining respective oscillating frequencies of a plurality of ROs.

FIG. 5 illustrates an electrical circuit 500 enabling a plurality of ROs to be examined by multiplexing the plurality of ROs together. A plurality of ROs $510_{1-n}$ are connected to a MUX 520, wherein a global enable line EN is provided to the ROs $510_{1-n}$, and the respective OUTDIV2 line (or similar) for each RO is connected to the MUX 520 (e.g., output $Q_2$ of each RO is connected to a respective channel of the MUX 520). In an embodiment, $RO_1$ can be a first RO circuit comprising a first RO, a first plurality of NOR gates and a first plurality of latches, $RO_2$ can be a second RO circuit comprising a second RO, a second plurality of NOR gates and a second plurality of latches, $RO_n$ can be an $n^{th}$ RO circuit comprising a $n^{th}$ RO, an nth plurality of NOR gates and an $n^{th}$ plurality of latches, etc. A selection signal SEL can be utilized to switch the MUX 520 to a certain RO in the plurality of ROs $510_{1-n}$. The MUX 520 output is connected to a clock counter 530, which can be configured to output a DIVIDED_FREQ signal by way of the carry out of the counter. Further, the clock counter 530 can be configured to output an m-bit signal to a flip-flop device 540, which can be configured to output a count CNT_PER which can be configured to store the number of RO cycles measured at the end of a determined period of time. The enable line EN of the clock counter 530 and the clocking input CLK of the flip-flop device 540 can be sourced from an enable signal CNT_EN, wherein the CLK of the flip-flop 540 is operating inversely to the EN of the clock counter 530 based upon operation of inverter 550 on the signal CNT_EN.

Figure 6:
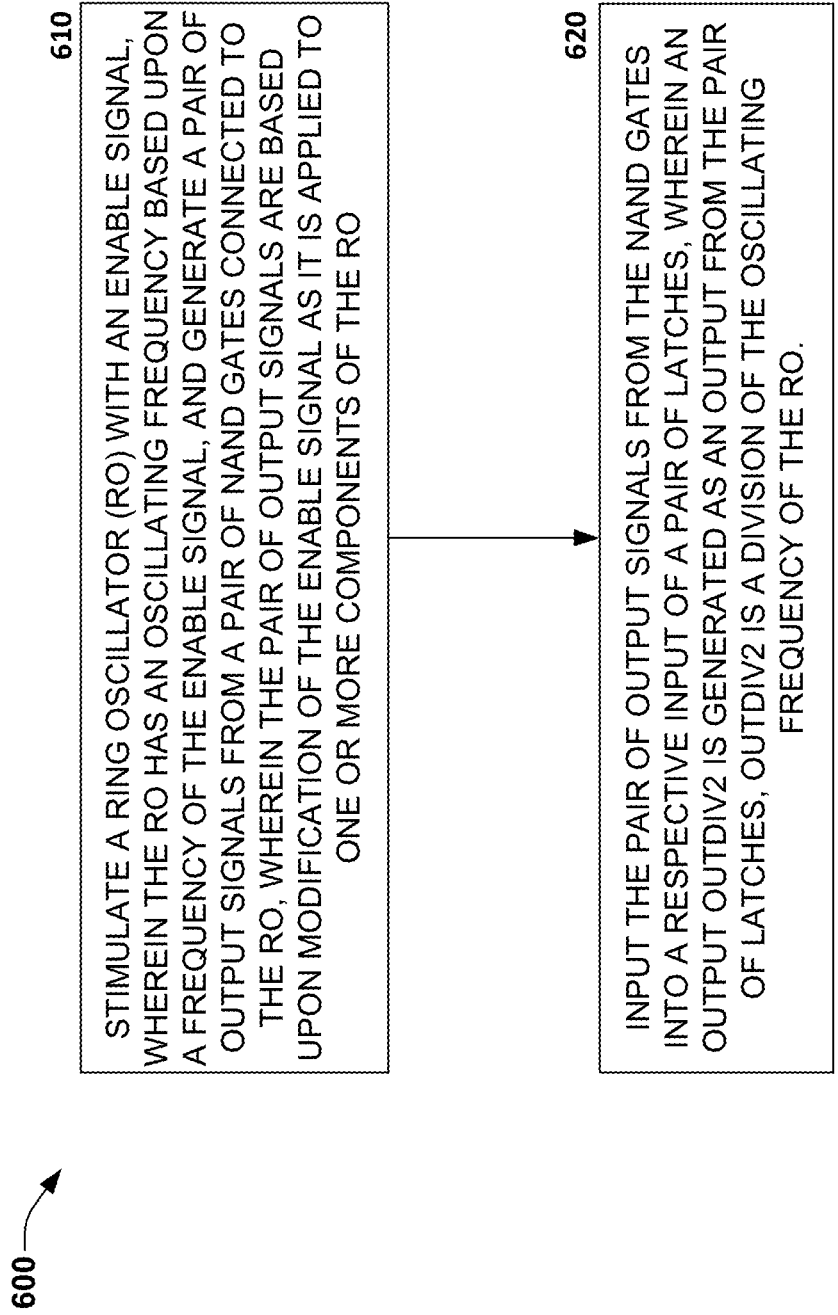
FIG. 6 is a flow diagram illustrating an exemplary methodology for enabling on-chip measurement of an oscillating frequency of a RO.

FIG. 6 illustrates an exemplary methodology relating to determining an oscillating frequency of a RO located on an IC, wherein the oscillating frequency is processed with a frequency divider. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

At 610, a RO is stimulated. The RO can comprise an odd-numbered amount of stages, wherein the stages comprise a NAND gate and a plurality of inverters connected in series. The plurality of inverters includes a penultimate inverter and a final inverter. A signal being output from the NAND gate, which is the input to the penultimate inverter in the case of a 3-stage RO, is input into a first channel of a first NOR gate in a pair of NOR gates. A signal output from the penultimate inverter is input to a first channel of a second NOR gate in the pair of NOR gates. A signal output from the final inverter is connected to second channels of both NOR gates in the pair of NOR gates. Hence, the second channels of both NOR gates receive the same input signal while the respective first channels receive signals that are also received by the penultimate inverter and the final inverter. Hence, based upon the sequence of initial NAND gate, inverters, subsequent pair of NOR gates, a pair of signals are generated based upon the single input utilized to operate the RO. The respective binary state of the signal being input into the pair of NOR gates is shown in Table 1.

At 620, respective outputs from the pair of NOR gates are fed into respective EN inputs of a pair of latches. The input D1 of the first latch being connected to the active-low output of the second latch Qn2, and the input D2 to the second latch connected to the active-high output Q1 of the first latch. The active-high output Q2 of the second latch is the oscillating signal frequency-divided by 2, OUTDIV2.

What has been described above includes examples of one or more embodiments. It is, of course, not possible to describe every conceivable modification and alteration of the above structures or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. An electrical circuit, comprising:
a ring oscillator (RO) comprising a plurality of stages, the RO configured to:
oscillate at a frequency when the RO is energized with a first electrical signal; and
output a first plurality of output signals from respective stages in the plurality of RO stages; and
a plurality of NOR gates, the plurality of NOR gates configured to respectively receive the first plurality of output signals and output a second plurality of output signals; and
a plurality of latches, the plurality of latches configured to respectively receive the second plurality of output signals and generate an output, wherein the output is division of an oscillating frequency of the RO by an integer.

2. The electrical circuit of claim 1, wherein the electrical circuit is located in an application-specific integrated circuit (ASIC).

3. The electrical circuit of claim 1, wherein the electrical circuit forms part of a physical unclonable function (PUF).

4. The electrical circuit of claim 1, wherein the integer is a factor of 2.

5. The electrical circuit of claim 4, wherein the plurality of latches comprise a first latch and a second latch, and an oscillating frequency of a signal output by the second is half the oscillating frequency of the RO.

6. The electrical circuit of claim 4, wherein the plurality of latches comprise a first latch, a second latch, a third latch, and a fourth latch, and an oscillating frequency of a signal output by the second latch is half the oscillating frequency of the RO, and an oscillating frequency of a signal output by the fourth latch is one quarter of the oscillating frequency of the RO.

7. The electrical circuit of claim 6, wherein the plurality of stages forming the RO comprise a NAND gate and a plurality of inverters, wherein the first electrical signal is applied to the NAND gate, and a NAND output signal from the NAND gate is input into a first inverter in the plurality of inverters and input into a first input of a first NOR gate in the plurality of NOR gates, a first inverter output signal from the first inverter is input into a second inverter and input into a first input of a second NOR gate in the plurality of NOR gates, and a third inverter output signal from the second inverter is input into a second input of the first NOR gate and is input into a second input of the second NOR gate in the plurality of NOR gates.

8. The electrical circuit of claim 7, the first latch comprises an input $EN_{-1}$, an input $D_{-1}$, an output $Q_{-1}$, and an output $Qn_{-1}$, the second latch comprises an input $EN_{-2}$, an input $D_{-2}$, an output $Q_{-2}$, and an output $Qn_{-2}$, wherein the output of the first NOR gate is connected to the $EN_{-1}$ input of the first latch, the output of the second NOR gate is connected to the $EN_{-2}$ input of the second latch, the $Qn_{-2}$ output of the second latch is connected to the $D_{-1}$ input of the first latch, the $Q_{-1}$ output of the first latch is connected to the $D_{-2}$ input of the second latch, and the oscillating frequency is measured at the output $Q_{-2}$ of the second latch.

9. The electrical circuit of claim 7, wherein the plurality of RO stages further comprises a third inverter and a fourth inverter, wherein the third inverter and the fourth inverter are located in series between the NAND gate and the first inverter in the plurality of RO stages.

10. The electrical circuit of claim 1, wherein the RO, the plurality of NOR gates and the plurality of latches form a first RO circuit located in an application-specific integrated circuit (ASIC), the ASIC further comprising a second RO circuit, wherein the second RO circuit further comprising:
   a second RO comprising a second plurality of inverters, the second RO configured to oscillate at a second frequency when the second RO is energized with the first electrical signal and output a third plurality of output signals;
   a second plurality of NOR gates, the second plurality of NOR gates configured to respectively receive the third plurality of output signals and output a fourth plurality of output signals; and
   a second plurality of latches, the second plurality of latches configured to respectively receive the fourth plurality of output signals and generate a second output, wherein the second output facilitates determination of a second oscillating frequency of the second RO.

11. The electrical circuit of claim 10, further comprising:
   a multiplexor (MUX), wherein the first RO circuit and the second RO circuit are connected to the MUX to facilitate selection for oscillating frequency determination; and
   a counter configured to receive an output from the MUX to enable determination of at least one of the oscillating frequency of the RO or the second oscillating frequency of the second RO.

12. An application-specific integrated circuit (ASIC), comprising:
   a ring oscillator (RO) comprising a plurality of stages, the RO configured to:
      oscillate at a frequency when the RO is energized with a first electrical signal; and
      and output a first plurality of output signals from respective stages in the plurality of RO stages; and
   a plurality of NOR gates, the plurality of NOR gates configured to respectively receive the first plurality of output signals and output a second plurality of output signals; and
   a plurality of latches, the plurality of latches configured to respectively receive the second plurality of output signals and generate an output, wherein the output facilitates determination of an oscillating frequency of the RO.

13. The ASIC of claim 12, wherein the output has an oscillating frequency that is a fraction of the oscillating frequency of the RO.

14. The ASIC of claim 13, wherein the plurality of latches comprises a first latch and a second latch, and an oscillating frequency of a signal output by the second latch is half the oscillating frequency of the RO.

15. The ASIC of claim 13, wherein the plurality of latches comprises a first latch, a second latch, a third latch, and a fourth latch, and an oscillating frequency of a signal output by the second latch is half the oscillating frequency of the RO, and an oscillating frequency of a signal output by the fourth latch is one quarter of the oscillating frequency of the RO.

16. The ASIC of claim 15, wherein the plurality of RO stages comprise a NAND gate, a first inverter, and a second inverter, wherein the first electrical signal is applied to the NAND gate, and a NAND output signal from the NAND gate is input into the first inverter and input into a first input of a first NOR gate in the plurality of NOR gates, a first inverter signal from the first inverter is input into the second inverter and input into a first input of a second NOR gate in the plurality of NOR gates, a third inverter signal from the second inverter is input into a second input of the first NOR gate and is input into a second input of the second NOR gate.

17. The ASIC of claim 16, wherein the RO further comprises a third inverter and a fourth inverter, wherein the third inverter and the fourth inverter are located in series between the NAND gate and the first inverter.

18. The ASIC of claim 16, the first latch comprises an input $EN_{-1}$, an input $D_{-1}$, an output $Q_{-1}$, and an output $Qn_{-1}$, the second latch comprises an input $EN_{-2}$, an input $D_{-2}$, an output $Q_{-2}$, and an output $Qn_{-2}$, wherein the output of the first NOR gate is connected to the $EN_{-1}$ input of the first latch, the output of the second NOR gate is connected to the $EN_{-2}$ input of the second latch, the $Qn_{-2}$ output of the second latch is connected to the $D_{-1}$ input of the first latch, the $Q_{-1}$ output of the first latch is connected to the $D_{-2}$ input of the second latch, and the oscillating frequency is measured at the output Q of the second latch.

19. An application-specific integrated circuit (ASIC) comprising:
   a ring oscillating (RO) means configured to:
      oscillate at a particular frequency when energized with an excitation signal; and
      output a first plurality of signals from respective stages of the RO means during operation with the excitation signal; and
   a frequency dividing means configured to generate a frequency divided signal based upon the first plurality of signals output from the respective stages of the RO means when the RO means is energized by the excitation signal, wherein the frequency divided signal is indicative of the particular frequency at which the RO oscillates, and further wherein the frequency dividing means comprises:
      a plurality of NOR gates, the plurality of NOR gates configured to respectively receive the first plurality of output signals and output a second plurality of output signals; and
      a plurality of latches, the plurality of latches configured to respectively receive the second plurality of output signals and generate the frequency divided signal.

20. The ASIC of claim 19, wherein the frequency divided signal is a fraction of an oscillating frequency of the RO means when the RO means is energized by the excitation signal.

* * * * *